United States Patent [19]

Katoh

[11] Patent Number: 5,912,835
[45] Date of Patent: Jun. 15, 1999

[54] NON-VOLATILE FERROELECTRIC MEMORY DEVICE FOR STORING DATA BITS RESTORED UPON POWER-ON AND INTERMITTENTLY REFRESHED

[75] Inventor: Yuukoh Katoh, Tokyo, Japan

[73] Assignee: NEC Corporation, Tokyo, Japan

[21] Appl. No.: 08/879,483

[22] Filed: Jun. 6, 1997

[30] Foreign Application Priority Data

Jun. 6, 1996 [JP] Japan .................................. 8-143924

[51] Int. Cl.$^6$ ............................................. G11C 11/22
[52] U.S. Cl. ...................... 365/145; 365/222; 365/230.06
[58] Field of Search ..................................... 365/145, 222, 365/230.06, 177

[56] References Cited

U.S. PATENT DOCUMENTS

5,270,967  12/1993  Moazzami et al. ...................... 365/145
5,559,733  9/1996  McMillan et al. ...................... 365/145

Primary Examiner—David Nelms
Assistant Examiner—Hoai V. Ho
Attorney, Agent, or Firm—Foley & Lardner

[57] ABSTRACT

A non-volatile ferroelectric memory cell includes a ferroelectric capacitor polarized in either direction representative of one of the logic levels of a data bit and a field effect transistor connected between a bit line and a ground line and having a gate electrode connected to one of the electrodes of the ferroelectric capacitor, and the polarization in the ferroelectric capacitor induces movable electric charge in the gate electrode so as to change the threshold of the field effect transistor between a high level and a low level; when the movable electric charge is undesirably leaked from the gate electrode, a data restoring circuit checks the ferroelectric capacitor to see whether the polarization is directed in one direction or the other direction, and a driving circuit makes up the movable electric charge so as to enhance the reliability of the data bit stored therein.

20 Claims, 5 Drawing Sheets

NON-VOLATILE FERROELECTRIC MEMORY DEVICE FOR STORING DATA BITS RESTORED UPON POWER-ON AND INTERMITTENTLY REFRESHED

FIELD OF THE INVENTION

This invention relates to a non-volatile ferroelectric memory device and, more particularly, to a non-volatile ferroelectric memory device for storing data bits restored upon a power-on event and intermittently refreshed and a method of controlling the non-volatile ferroelectric memory device.

DESCRIPTION OF THE RELATED ART

The non-volatile ferroelectric memory cell has been proposed as a ferroelectric substance/conductor/paraelectric substance structure or a ferroelectric substance/conductor structure coupled to the gate electrode of a MOS (metal-oxide-Semiconductor) field effect transistor, and stores a bit of data information in the form of remanence.

Figure 1:
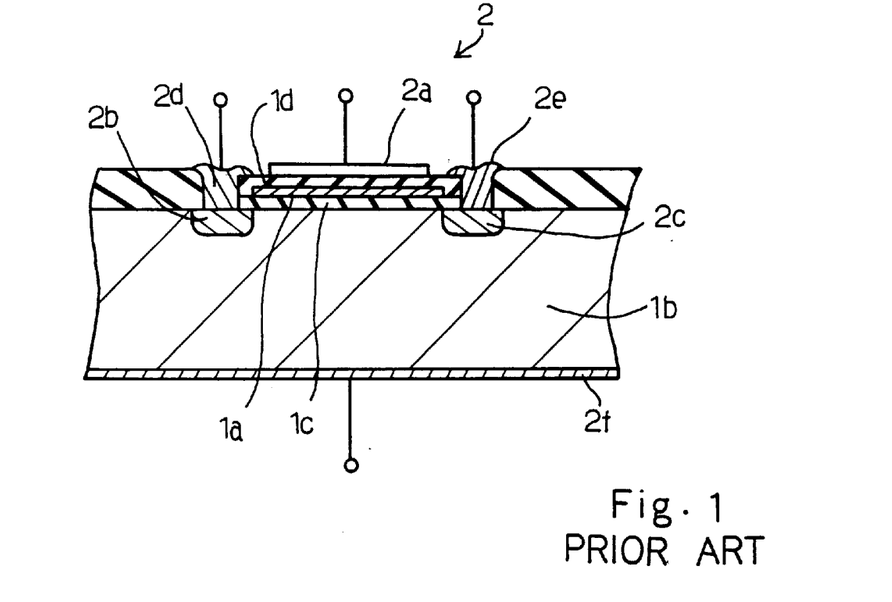
FIG. 1 is a cross sectional view showing the structure of the prior art non-volatile memory cell disclosed in Japanese Patent Publication of Unexamined Application No. 51-108582.

Firstly, description is made on an example having the ferroelectric substance/conductor/paraelectric substance structure coupled to the gate electrode. FIG. 1 illustrates the cross sectional structure of the prior art non-volatile memory device disclosed in Japanese Patent Publication of Unexamined Application No. 51-108582. In the prior art example shown in FIG. 1, the conductor is implemented by a low-resistive polysilicon layer 1a, and a p-type silicon substrate 1b is stacked with a silicon oxide layer 1c, the polysilicon layer 1a, a ferroelectric layer 1d of bismuth titanate and a gate electrode 2a of a field effect transistor 2. On surface portions of the silicon substrate 1b on both sides of the polysilicon layer 1a are formed an n-type source region 2b and an n-type drain region 2c with which a source electrode 2d and a drain electrode 2e are held in contact. Furthermore, an ohmic electrode 2f is formed on the reverse surface of the silicon substrate 1b.

Figure 2:
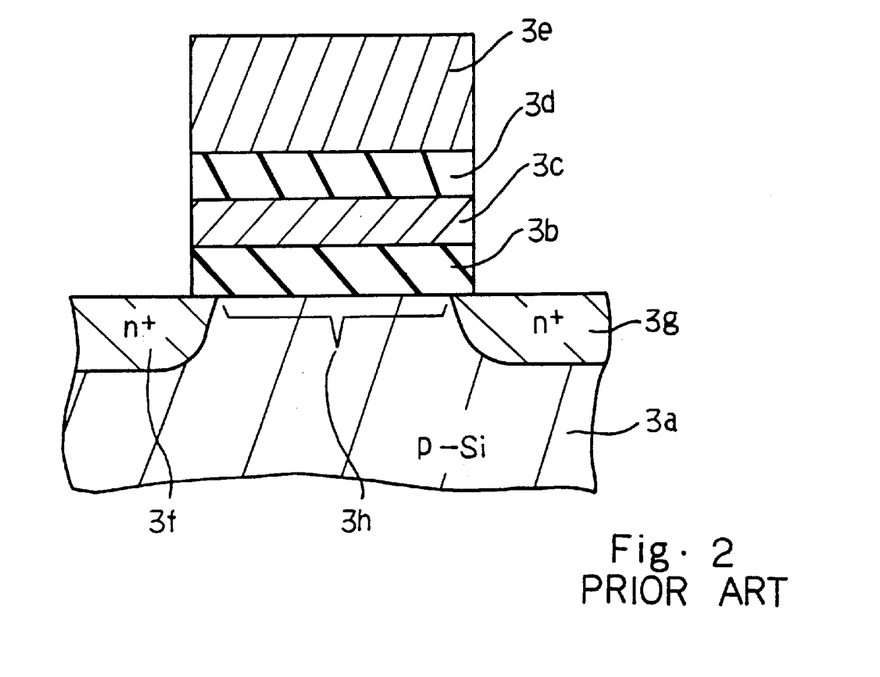
FIG. 2 is a cross sectional view showing the structure of the prior art non-volatile memory cell disclosed in Japanese Patent Publication of Unexamined Application No. 5-145077.

FIG. 2 illustrates the cross sectional structure of the prior art non-volatile ferroelectric memory cell disclosed in Japanese Patent Publication of Unexamined Application No. 5-145077. In the prior art example, platinum is used for the conductor, and a p-type silicon well 3a is stacked with a dielectric layer 3b of $SrTiO_3$, a platinum layer 3c, a ferroelectric layer of $PbTiO_3$ and a platinum gate layer 3e. In surface portions of the p-type silicon well 3a on both sides of the dielectric layer 3b, an n-type source region 3f and an n-type drain region 3g are formed, and a channel 3h is assigned to a surface portion therebetween.

A bit of data information is written into the memory cells shown in FIGS. 1 and 2 as follows. A suitable potential is applied to the substrate 1b or the well 3a, and the gate electrode is positively (or negatively) biased with respect thereto. Then, the ferromagnetic layer 1d or 3d is polarized due to the electric field in the ferromagnetic layer 1d or 3d. Positive or negative electric charge is accumulated in the surface of the conductive layer, i.e., the polysilicon layer 1a or the platinum layer 3c depending upon the magnitude of the polarization so as to compensate the polarization, and, accordingly, electric charge with the opposite polarity is accumulated in the reverse surface of the conductive layer. This results in an electron or hole being induced on the channel region of the silicon substrate. Even if the gate potential is removed, the induced electric charge is left there due to the remanence of the ferroelectric layer. Thus, the structure serves as a non-volatile memory cell.

When reading out the bit of data information, a suitable potential is applied to the drain region 2c/3g, and the stored bit is determined on the basis of the amount of drain current. The gate electrode 2a/3e is biased to a certain potential either equal to or different from the bias potential at the substrate 1b/3a.

Figure 3:
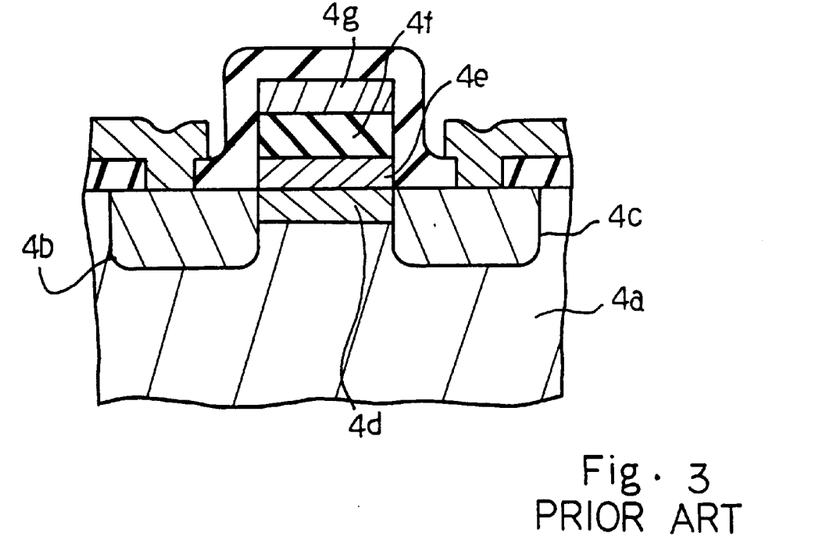
FIG. 3 is a cross sectional view showing the structure of the prior art non-volatile memory cell disclosed in Japanese Patent Publication of Unexamined Application No. 5-135570.

FIG. 3 illustrates the cross sectional structure of the prior art memory cell disclosed in Japanese Patent Publication of Unexamined Application No. 5-135570, and the multi-layer structure of ferroelectric substance and the conductive substance serves as the gate structure. In this instance, the substrate 4a is formed of gallium arsenide, and a heavily doped n-type source region 4b and a heavily doped n-type drain region 4c are spaced from each other in the surface portion of the gallium arsenide substrate 4a. A lightly doped channel region 4d is formed between the heavily doped n-type source region 4b and the heavily doped n-type drain region 4c, and is stacked with a conductive layer 4e of platinum, a ferroelectric layer 4f and a gate electrode 4g. A schottky barrier takes place between the lightly doped n-type channel region 4d and the conductive layer 4e, and electrically isolates the conductive layer 4e from the lightly doped n-type channel region 4d.

This prior art non-volatile memory cell stores a data bit through a write-in operation similar to those of the above described prior art memory cells, and the data bit is read out therefrom through a read-out operation also similar to those of the prior art memory cells.

Figure 4:
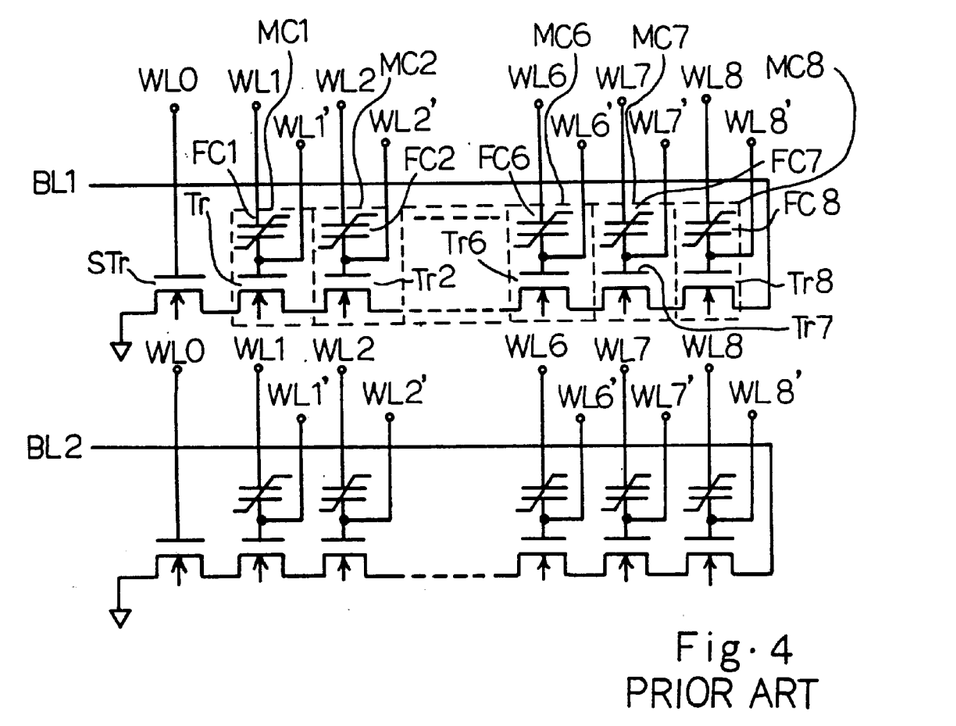
FIG. 4 is a circuit diagram showing the circuit configuration of the prior art non-volatile ferroelectric memory device disclosed in Japanese Patent Publication of Unexamined Application No. 5-136378.

FIG. 4 illustrates the circuit configuration of prior art non-volatile memory device disclosed in Japanese Patent Publication of Unexamined Application No. 5-136378. Although two memory cell blocks are illustrated in FIG. 4, description is focused on the memory cell block associated with a bit line BL1. The other memory cell block associated with a bit line BL2 has the same circuit configuration as the memory cell block associated with the bit line BL1.

Ferroelectric capacitors FC1, FC2, . . . , FC6, FC7 and FC8 are respectively connected between the gate electrodes of field effect transistors Tr1, Tr2, . . . , Tr6, Tr7 and Tr8 and word lines WL0, WL1, WL2, . . . , WL6, WL7 and WL8, and a selecting transistor STr and the field effect transistors Tr1 to Tr8 are connected in series between a source of constant potential and a bit line BL1. Each of the ferroelectric capacitor FC1, . . . or FC8 and the associated field effect transistor Tr1, . . . or Tr8 form in combination one of non-volatile memory cells MC1, MC2, . . . , MC6, MC7 and MC8. The gate electrodes of the field effect transistors Tr1 to Tr8 are further connected to word lines WL1' to WL8', respectively.

Assuming now that a data bit is written into the memory cell MC1, a positive potential is applied to the bit line BL1, and the other bit lines such as BL2 are grounded. The word line WL1 is grounded, and the word line WL1' is changed to open. The other word lines WL2 to WL8 and WL2' to WL8' are biased to a positive potential level. A positive potential level is applied to the bit line BL1.

The field effect transistors Tr2 to Tr8 turn on, and the positive potential level on the bit line BL1 is propagated through the field effect transistors Tr8 to Tr2 to the field effect transistor Tr1 of the memory cell MC1. Then, the ferroelectric capacitor FC1 is polarized, and the data bit is written into the memory cell MC1.

When the data bit is read out from the memory cell MC1, the bit line BL1 is connected to a sense amplifier (not shown). The sense amplifier is electrically isolated from the other bit lines BL2. The word line WL1 is grounded, and the word line WL4' is changed to the open state. The other word lines are biased to the positive potential level. The field effect transistors Tr8 to Tr2 turn on, and the field effect transistor Tr1 determines the conductive channel depending upon the remanence of the ferroelectric capacitor FC1. If the field effect transistor Tr1 creates the conductive channel, current flow through the conductive channel to the constant potential source, and the sense amplifier detects the current. On the other hand, if the field effect transistor Tr1 does not create the conductive channel, the current does not flow into the constant potential source, and the sense amplifier determines the logic level of the data bit stored in the memory cell MC1 depending upon the amount of current.

The prior art memory cells encounter a problem in that the data bit tends to be lost. In detail, when the conductive layer 1a, 3c or 4e is electrically isolated from another electric circuit, the prior art memory cell maintains the data bit for long time. However, the conductive layer 1a, 3c or 4e is connected to a word line driver (not shown) so as to selectively drive the word lines WL1' to WL8'. The word lines WL1' to WL8' are selectively biased to the positive potential level, and the positive potential level is discharged. The induced electric charges tend to be lost, because the polarized ferroelectric layer 1d, 3d or 4f attracts only one kind of electric charge induced at the interface therebetween. This means that the other kind of electric charge is free, and the electric charge is leaked through the p-n junction of a driving transistor of the word line driver. Although the p-n junction is reversely biased, the reversely biased p-n junction can not perfectly prevent the source/drain region of the driving transistor from leakage. Moreover, when the prior art non-volatile ferroelectric memory device is powered off, the reverse bias is removed from the p-n junction of the driving transistor, and the other kind of electric charge easily exceeds the p-n junction.

The ferroelectric layer 1d, 3d or 4f does not directly affect the channel region. When the ferroelectric layer 1d, 3d or 4f is polarized, the two kinds of electric charge are induced on both sides of the conductive layer 1a, 3c or 4e. One of the two kinds of electric charge induces electric charge in the channel region, and changes the channel conductance. This means that, even if the ferroelectric layer 1d, 3d or 4f maintains the polarized state, the prior art ferroelectric memory cell loses the data bit.

SUMMARY OF THE INVENTION

It is therefore an important object of the present invention to provide a non-volatile ferroelectric memory device which recovers a non-volatile ferroelectric memory cell from the loss of a data bit.

It is also an important object of the present invention to provide a method of controlling the non-volatile ferroelectric memory device.

To accomplish the object, the present invention proposes to restore a data bit to a non-volatile ferroelectric memory cell upon a power-on and periodically refresh a data bit during the operation.

In accordance with one aspect of the present invention, there is provided a non-volatile ferroelectric memory device comprising: a plurality of addressable memory cells for storing data bits therein, respectively, each of said plurality of addressable memory cells including a capacitor having a ferroelectric layer sandwiched between first and second electrodes and polarized in a first direction representative of a first logic level of one of said data bits or a second direction representative of a second logic level of said one of said data bits, a field effect transistor having a channel region connected at one end thereof to a constant potential line and a gate electrode connected to said second electrode for changing a threshold between a first level and a second level depending upon the direction of said polarization due to a movable electric charge induced therein in the presence of said polarization, and a switching element having a control node, a first node and a second node connected to said gate electrode; a plurality of word lines selectively connected to the first electrodes of the capacitors of said plurality of addressable memory cells; a plurality of bit lines selectively connectable to the other ends of the channels of the field effect transistors of said plurality of addressable memory cells; a plurality of bias lines selectively connected to the first nodes of the switching elements of said plurality of addressable memory cells; a plurality of control lines selectively connected to the control nodes of the switching elements of said plurality of addressable memory cells; a driver circuit selectively biasing said plurality of word lines, said plurality of bit lines, said plurality of bias lines and said plurality of control lines for selectively writing said data bits into said plurality of addressable memory cells, selectively reading out said data bits and compensating the gate electrodes of said field effect transistors for loss of the movable electric charges; and a charge compensating means checking the polarization of the ferroelectric layers of said plurality of addressable memory cells to see whether said ferroelectric layers have been polarized in said first direction or said second direction, and causing said driver circuit to compensate said gate electrodes of said field effect transistors for the loss of said movable electric charges.

In accordance with another aspect of the present invention, there is provided a method of controlling a nonvolatile ferroelectric memory device including at least one memory cell having a field effect transistor for providing one of a conductive channel and a resistive channel between a bit line and a constant potential line, a capacitor connected between the gate electrode of the field effect transistor and a word line and having a ferroelectric layer polarized in a certain direction representative of a logic level of a data bit and a switching transistor gated by a control line so as to connect a bias line to the gate electrode of the field effect transistor, comprising the steps of: a) biasing the gate electrode of the field effect transistor to a first potential level through the bias line without changing the direction of polarization; b) changing the word line to a second potential level high enough to orient the polarization to a predetermined direction to see whether or not the ferroelectric layer polarized in the predetermined direction induces a movable electric charge in the gate electrode for determine the certain direction representative of the logic level of the data bit; and c) changing the polarization of the ferroelectric layer and the gate electrode to the certain direction and a fifth potential level expected under the polarization in the certain direction.

In accordance with yet another aspect of the present invention, there is provided a method of controlling a non-volatile ferroelectric memory device including at least one memory cell having a field effect transistor for providing one of a conductive channel and a resistive channel between a bit line and a constant potential line in the presence of a movable electric charge, a capacitor connected between the gate electrode of the field effect transistor and a word line and having a ferroelectric layer polarized in a certain direction representative of a logic level of a data bit for inducing the movable electric charge in the gate electrode and a switching transistor gated by a control line so as to connect a bias line to the gate electrode of the field effect transistor, comprising the steps of: a) checking a clock to see whether or not a certain time period is expired; b) reading out the data bit from the at least one memory cell so as to determine the logic level of the data bit when the certain time period is expired; and c) supplementing the movable electric charge to the gate electrode.

BRIEF DESCRIPTION OF THE DRAWINGS

The features and advantages of the non-volatile ferroelectric memory device and the method according to the present invention will be more clearly understood from the following description taken in conjunction with the accompanying drawings in which.

DESCRIPTION OF THE PREFERRED EMBODIMENTS

First Embodiment

Figure 5:
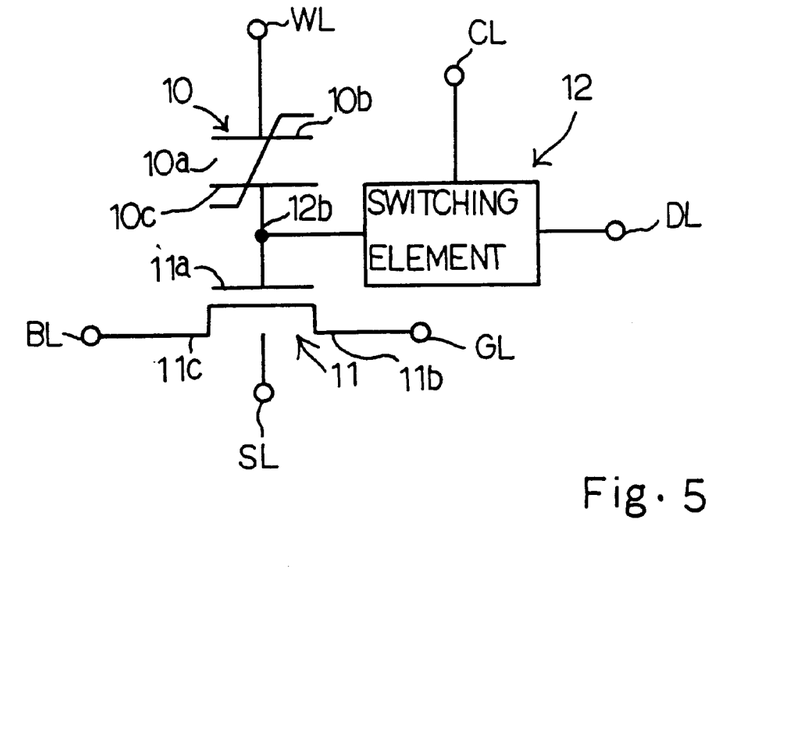
FIG. 5 is a circuit diagram showing the circuit configuration of a non-volatile ferroelectric memory cell according to the present invention.

FIG. 5 illustrates an essential part of a non-volatile ferroelectric memory cell embodying the present invention. The non-volatile ferroelectric memory cell comprises a ferroelectric capacitor 10, a field effect transistor 11 and a switching element 12. Although a switching transistor is incorporated in the memory cell for selecting the memory cell from a memory cell array, the switching transistor is not shown in FIG. 5.

The ferroelectric capacitor 10 has a ferroelectric layer 10a and two electrodes 10b/10c attached on both surfaces of the ferroelectric layer 10a. One of the electrodes 10b is connected to a word line WL, and the other electrode 10c is connected to the gate electrode 11a of the field effect transistor 11.

The field effect transistor 11 is fabricated on a semiconductor substrate or a well defined in the semiconductor substrate, and has a source node 11b and a drain node 11c. The source node 11b is connected to a constant potential source GL, and the drain node 11c is connected to a bit line BL. The semiconductor substrate or the well is biased through a bias line SL. A conductive layer may be shared between the ferroelectric capacitor 10 and the field effect transistor 11 so as to serve as the electrode 10c and the gate electrode 11a. The aforementioned switching transistor is connected between the bit line BL and the field effect transistor 11.

Figure 6:
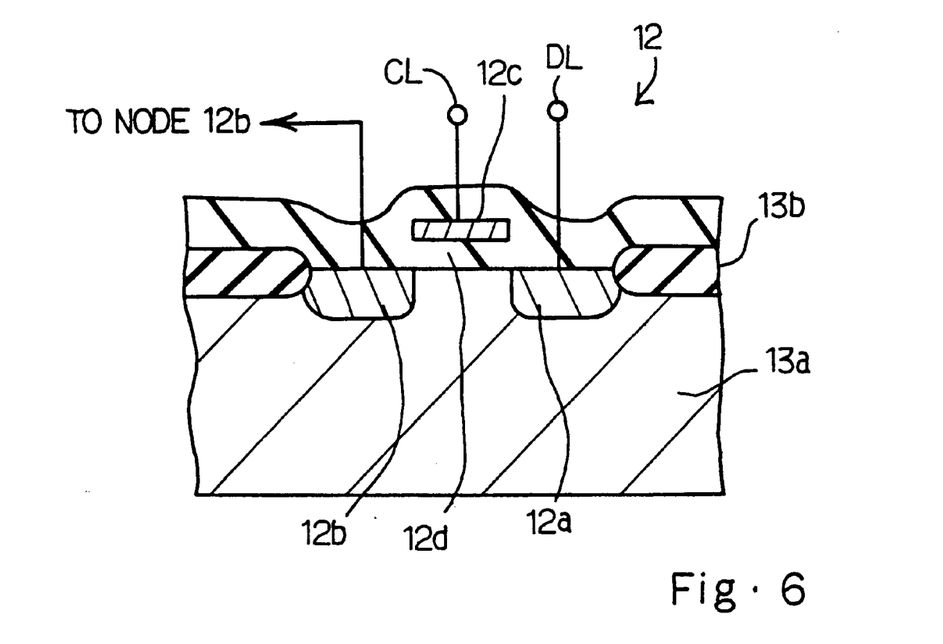
FIG. 6 is a cross sectional view showing the structure of a switching transistor incorporated in the non-volatile ferroelectric memory cell.

The switching element 12 is implemented by a field effect transistor as shown in FIG. 6, and the field effect transistor is also labeled with reference numeral 12 in the following description. The field effect transistor 12 is fabricated on the semiconductor substrate or another well 13a, and is electrically isolated from the field effect transistor 11 by means of a field oxide layer 13b. The field effect transistor 12 is gated by a control line CL so as to provide a conductive channel between a bias line DL and a node 12b. The bias line DL is connected to one of source and drain regions 12a/12b, and the node 12b is connected to the other of the source and drain regions 12a/12b. A gate electrode 12c is formed on a gate insulating layer 12d over a channel region between the source and drain regions 12a and 12b, and is connected to the control line CL.

The non-volatile ferroelectric memory cell stores a data bit similarly to the prior art non-volatile ferroelectric memory cell. In order to write a data bit into the non-volatile ferroelectric memory cell, the ferroelectric layer 10a is polarized, and the polarized ferroelectric layer 10a induces electric charge with the opposite polarity in a surface portion of the electrode 10c. The induced electric charge is attracted to the polarized ferroelectric layer 10a. Movable electric charge is further induced in the opposite surface portion of the electrode 10c, and has an electric influence on the channel region of the field effect transistor 11. The movable electric charge changes the channel conductance through the electrical induction and, accordingly, the threshold of the field effect transistor 11. When the polarized ferroelectric layer 10a induces the electric charge opposite to the channel conductivity type in the channel region, the induced electric charge changes the threshold from a low level to a high level. Thus, the memory cell 11 stores a data bit in the form of threshold of the field effect transistor 11.

Figure 7:
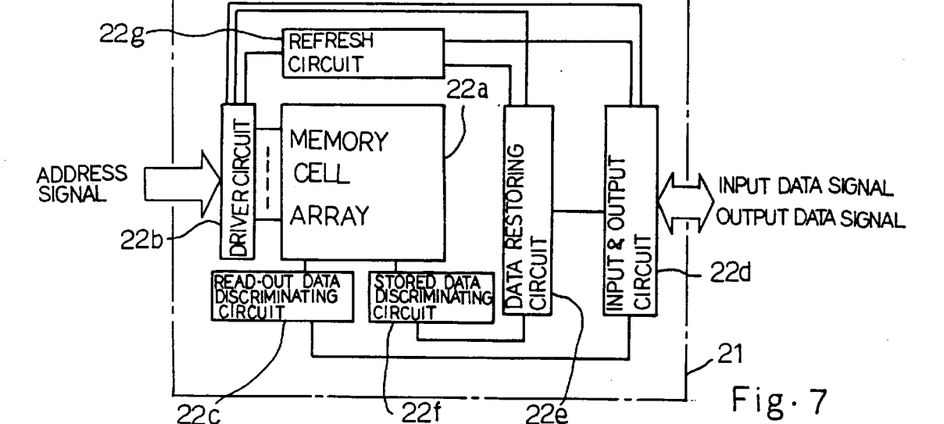
FIG. 7 is a block diagram showing the arrangement of a non-volatile ferroelectric memory device according to the present invention.

Using the memory cell shown in FIG. 5, a non-volatile ferroelectric memory device is fabricated on a semiconductor substrate 21 as shown in FIG. 7.

The non-volatile ferroelectric memory device comprises a memory cell array 22a, and a plurality of memory cells shown in FIG. 5 are arranged in matrix. The memory cell array 22a is accompanied with a driver circuit 22b, a read-out data discriminating circuit 22c, a data input/output circuit 22d, a data restoring circuit 22e, a stored data discriminating circuit 22f and a refresh circuit 22g, and these circuits 22b to 22g behave as follows.

The driver circuit 22b is connected to the word line WL, the control line CL, the bias lines DL/SL, the bit line BL and the constant potential source GL for each memory cell, and biases these lines to appropriate potential levels.

The read-out data discriminating circuit 22c is used in a read-out operation. As described hereinbefore, the field effect transistor 11 stores a data bit in the form of channel conductance, and the memory cell changes the amount of current passing through the field effect transistor 11 depending upon the channel conductance. The read-out data discriminating circuit 22c monitors the current, and determines a data bit stored in the memory cell to be in logic "1" level or logic "0" level.

The data input/output circuit 22d produces an output data signal representative of the logic level of the data bit stored in the memory cell, and supplies the output data signal to the outside of the non-volatile ferroelectric memory device. The data input output circuit 22d is further operative to receive an input data signal supplied from the outside of the non-volatile ferroelectric memory device.

When the non-volatile ferroelectric memory device is powered on, the data restoring circuit 22e reads out data bits from the memory cells, and restores the data bits into the memory cells. The non-volatile ferroelectric memory device does not allow an external device to write a new data bit into the memory cell array 22a and read out the data bit therefrom until completion of the restoring operation.

The stored data discriminating circuit 22f discriminates the remanence left in the ferroelectric capacitors 10 in the memory cell array 22a during the restoring operation.

The refresh circuit 22g periodically refreshes the data bits stored in the memory cell array 22a after the restoring operation.

Data Write-in

The non-volatile ferroelectric memory device is controlled as follows. Assuming now that a data bit is written into one of the memory cells of the array 22a, the control line CL causes the switching element 12 to turn off, and the node 12b is electrically isolated from the bias line DL. The driving circuit 22b selects the word line WL and the bit line BL connected to selected one of the memory cells, and appropriately biases the word line WL, the bias line SL and the bit line BL so as to polarize the ferroelectric layer 10a. If the driving circuit 22b selects a plurality of bit lines together with a word line, a data bit is concurrently written into the memory cells connected to the bit lines. After the polarization, the ferroelectric layer 10a induces two kinds of electric charge in the electrode 10c, and are separated between a surface portion close to the ferroelectric layer 10a and a surface portion close to the gate insulating layer of the field effect transistor 11, because the switching element 12 keeps the node 12b and, accordingly, the electrodes 10c/11a in the floating state. The remanence maintains the write-in state after removal of the bias potential.

Data Read-out

When an external device accesses one of the memory cells, current is supplied through the bit line BL to the field effect transistor 11, and the driver circuit 22b biases the word line WL to a read-out potential level between the low threshold and the high threshold. If the field effect transistor 11 of the accessed memory cell has the low threshold, the field effect transistor 11 turns on so as to discharge the current from the bit line BL to the constant potential source GL, and a large amount of current flows through the bit line BL. On the other hand, if the field effect transistor 11 has the high threshold, the field effect transistor 11 is turned off, and only a negligible amount of current flows through the bit line BL. The read-out data discriminating circuit 22c monitors the current, and determines the data bit stored in the accessed memory cell to be in logic "1" level or logic "0" level. Thus, the data bit is read out from the accessed memory cell without destruction of the polarization.

Data Restoring

When the non-volatile ferroelectric memory device is powered off, most of the movable electric charge is gradually leaked with time. Even if the movable charge is lost, the ferroelectric layer 10a is still polarized, and the remanence is available for recovery of the stored data bit. For this reason, the data restoring circuit 22e firstly instructs the stored data discriminating circuit 22f to check the remanence to see whether each memory cell stored a data bit of logic "1" level or a data bit of logic "0" level in cooperation with the driver circuit 22b. When the stored data discriminating circuit 22f decides the memory cell to have been in the write-in state, the data restoring circuit 22e instructs the driver circuit 22b to polarize the ferroelectric layer 10a of the memory cell, and the driver circuit 22b recovers the memory cell from loss of the movable electric charge. While the stored data discriminating circuit 22f and the driver circuit 22b is restoring the data bit, the data storing circuit 22e prohibits an external device from writing a new data bit and reading out the data bit.

The remanence is checked as follows. The driver circuit 22b biases the word line WL and the bias line DL to the same potential level, and changes the control line CL to an active level. Then, the switching element 12 turns on, and the potential level is transferred from the bias line DL to the node 12b. Thereafter, the bias line DL is caused to enter into floating state, and the word line WL is lifted to a certain potential level. If the ferroelectric capacitor 10 is polarized in the opposite direction to the applied potential, the certain potential level causes an inversion of polarization to take place. The word line WL is decayed thereafter. If the inversion of polarization does not take place, the potential level on the bias line DL is changed to a potential level determined by dividing the potential level on the word line WL between the capacitance of the ferroelectric capacitor 10 and the parasitic capacitance of the bias line DL. On the other hand, if the inversion of polarization takes place, the induced electric charge changes the potential level on the bias line DL. The bias line DL propagates the potential level to the stored data discriminating circuit 22f, and the stored data discriminating circuit 22f compares the potential level on the bias line DL with a reference level so as to determine whether or not the memory cell was in the write-in state. The reference level is regulated to an intermediate value between the potential level without the inversion of polarization and the potential level affected by the inversion of polarization.

Another method for checking the ferroelectric capacitor 10 is similar to the above described method until the word line WL is lifted to the certain level, and the potential level at the node 12b is different by a certain value corresponding to the electric charge due to the inversion of polarization. The potential level at the node 12b affects the channel conductance of the field effect transistor 11. For this reason, the difference of the potential level at the node 12b is discriminative as the amount of drain current passing through the field effect transistor 11. An appropriate bias may be applied to the word line WL.

When the stored data discriminating circuit 22f determines the previous state of the ferroelectric capacitor 10, the data restoring circuit 22e instructs the driver circuit 22b to restore the data bit in the memory cell. Firstly, the driver circuit 22b changes the bias line DL and the node 12b to the initial level, and writes the data bit into the memory cell as described hereinbefore.

Another data write-in method is to simply bias the node 12b to one of the potential levels representative of logic "1" level and logic "0" level through the bias line DL. When the inversion does not take place, the node 12b is biased to the potential level to be changed through the data write-in. On the other hand, when the inversion takes place, the polarization is inverted again, and the node 12b is biased to the potential level to be changed through the data write-in.

Upon restoring the previous data bit, the data restoring circuit 22e allows an external device to access any data bit stored in the memory cell array 22a and write a new data bit into the memory cell array 22a.

The non-volatile ferroelectric memory device according to the present invention recovers each of the memory cells from the loss of movable electric charge on the basis of the remanence in the ferroelectric capacitor 10. For this reason, even if the non-volatile ferroelectric memory device has been powered off for a long time, the previous data bits are restored in the memory cells, and the data restoring enhances the reliability of the data bits to be accessed.

Data Refresh

As described hereinbefore, the movable electric charge gradually flows out from the node 12b, and the refresh circuit 22g periodically refreshes the data bits stored in the memory cell array 22a.

The refresh circuit 22g has a counter for lapse of time from the previous data refresh, and checks the counter to see whether or not the lapse of time exceeds a predetermined time period. The memory cell can maintain the data bit within the predetermined time period. When the predetermined time period is expired, the refresh circuit 22g starts a data refreshing sequence. Firstly, the refresh circuit 22g prohibits an external device from a data write-in and a data read-out. Thereafter, the refresh circuit 22g instructs the driver circuit 22b to check each memory cell whether to be in logic "1" level or logic "0" level. The driver circuit 22b appropriately biases the associated lines BL and WL as similarly to the data read-out, and the read-out data discriminating circuit 22c reports the logic level of the read-out data bit through the input/output circuit 22d to the refresh circuit 22g.

When the memory cell is in the data write-in state, the driver circuit 22b writes the data bit into the memory cell as follows. Firstly, a potential difference is applied between the word line WL and the bias line DL so as to polarize the ferroelectric layer 10a in a predetermined direction, and the potential level at the node 12b is biased to the initial potential level. The driver circuit 22b changes the control line CL to the inactive level, and causes the switching element 12 to turn off. Subsequently, the driver circuit 22b biases the word line WL, the semiconductor substrate/well and the bit line BL so as to polarize the ferroelectric layer 10a representative of the data write-in state.

Alternatively, the electric charge already leaked are compensated. The driver circuit 22b causes the switching element 12 to turn on, and biases the node 12b to the potential level immediately after the data write-in through the bias line DL.

The data refresh may be not periodical in so far as the movable electric charge is decreased to non-discriminative level.

The non-volatile ferroelectric memory device enhances the reliability of stored data bits through the data refresh.

Figure 8:
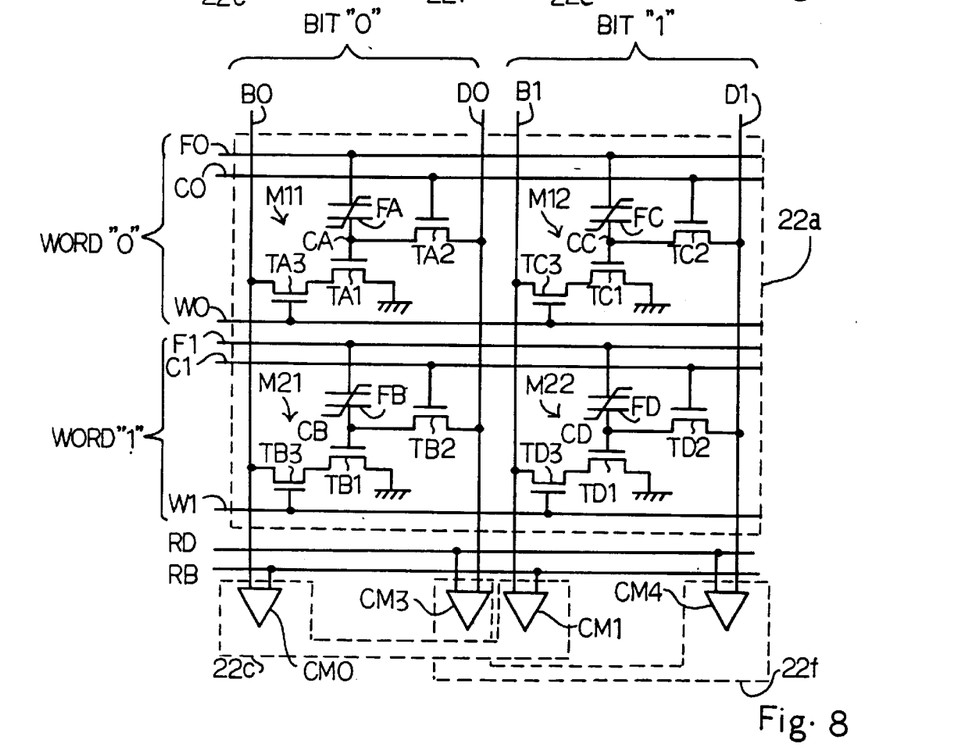
FIG. 8 is a circuit diagram showing a part of the memory cell array incorporated in the non-volatile ferroelectric memory device.

FIG. 8 illustrates a part of the memory cell array 22a. Four memory cells M11, M12, M21 and M22 form the part of the memory cell array 22a. The memory cells M11/M12 and M21/M22 form parts of two rows of the memory cell array 22a, and the two rows are referred to "word 0" and "word 1", respectively. On the other hand, the memory cells M11/M21 and M12/M22 belong to two columns of the memory cell array 22a, and the two columns are respectively referred to "bit 0" and "bit 1". Row addresses are assigned to the two rows of the memory cell array 22a, respectively, and column addresses are assigned to the two columns of the memory cell array 22a, respectively. Therefore, each of the memory cells M11 to M22 is specified with a row address and a column address.

Ferroelectric capacitors FA/FB/FC/FD are corresponding to the ferroelectric capacitor 10, and field effect transistors TA1/TB1/TC1/TD1 behave as similar to the field effect transistor 11. The switching element 12 is implemented by a field effect transistor TA2/TB2/TC2/TD2, and switching transistors TA3/TB3/TC3/TD4 are connected between bit lines B0/B1 and the field effect transistors TA1/TB1/TC1/TD1, respectively. As described hereinbelow, when a data bit is read out from one of the memory cells M11 to M22, the ground potential is applied to selected ferroelectric capacitors, and, for this reason, the field effect transistors TA1 to TD1 are designed to widely change the drain current depending upon the logic level of the data bit under the application of the ground potential.

The bit lines B0/B1 are connected to differential amplifiers CM0/CM1 of the read-out data discriminating circuit 22c, and differential amplifiers CM0/CM1 respectively compare the potential levels on the bit lines B0/B1 with a reference potential on a reference line RB. The switching elements TA2/TB2 and TC2/TD2 are connected to bias lines D0/D1, and differential amplifiers CM3/CM4 compare the potential levels on the bias lines D0/D1 with a reference potential on a reference line RD. Word lines F0/F1 are connected to the ferroelectric capacitors FA/FC and FB/FD, respectively, and the switching transistors TA3/TC3 and TB3/TD3 are gated by word lines W0 and W1, respectively. The switching elements TA2/TC2 and TB2/TD2 are gated by control lines C0 and C1, respectively, and the ground line serves as the bias line SL.

Though not shown in FIG. 8, the bit lines B0/B1, the bias lines D0/D1, the word lines F0/F1 and W0/W1 and the control lines C0/C1 are connected to the driver circuit 22b, and the driver circuit 22b selects one of the bit lines B0/B1 and one of the bias lines D0/D1 on the basis of the column address represented by an address signal supplied from the outside and one of the word lines F0/F1, one of the word lines W0/W1 and one of the control lines C0/C1 on the basis of the row address also represented by the address signal. The non-volatile ferroelectric memory device is powered with a positive potential level vdd, and the positive potential level Vdd is high enough to polarize the ferroelectric layers of the capacitors FA to FD.

Assuming now that data bits are concurrently written into word "1", the driver circuit 22b changes the control line C0 to an inactive level so that the switching elements TA2/TC2 turn off. The driver circuit 22b further changes the word line F0 to the ground level, and selectively applies the positive power voltage level and the ground level to the bit lines B0 and B1 depending upon the logic level of the data bits. The driver circuit 22b changes the word line W0 to an active level so that the switching transistors TA3/TC3 turn on. Subsequently, the driver circuit 22b lifts the word line F0 to the positive potential level Vdd, and, thereafter, decays the word line F0 to the ground level. A potential difference is applied between the word line F0 and the drain node of each field effect transistor TA1/TC1 at either timing when the word line F0 is changed to the positive power voltage level or the ground level. As a result, the ferroelectric layer of each capacitor CA/CB is polarized in a direction indicative of the logic level of the data bit, and the data bits are stored in word "0".

The polarized ferroelectric layer of each memory cell M11/M12 induces one of the two kinds of electric charge in a surface portion of the lower electrode thereof and the other kind of electric charge in a surface portion of the gate electrode of the field effect transistor TA1/TC1, and the movable electric charge in the gate electrode in turn induces electric charge of the opposite polarity in the channel region. Thus, the channel conductance is changed depending upon the direction of polarization, and the field effect transistor TA1/TC1 has either high or low threshold. After the data write-in, the driver circuit 22b changes the word line W0 to the inactive level so that the switching transistors TA3/TC3 turn off.

While the data bits are written into word "0", the driver circuit 22b maintains the word line F1 to the ground level, the control line C1 to the inactive level and the word line W1 to the inactive level, and the data write-in for word "0" does not affect the data bits stored in word "1".

The data bits stored in word "0" are assumed to be accessed. Upon completion of the data restoring or the previous data refreshing, the control line C0 is maintained at the inactive level, and the switching elements TA2/TC2 are turned off. The word line F0 is grounded, and the driver circuit 22b keeps the bit lines B0/B1 at a certain level low enough not to change the direction of polarization. The certain level may be 0.1 volt. The driver circuit 22b changes the word line W0 to the active level, and the switching transistors TA3/TC3 turn on, and the certain potential level is transferred to the drain nodes of the field effect transistors TA1/TC1. As described hereinbefore, each field effect transistor TA1/TC1 has either high or low threshold representative of the logic level of the data bit stored therein. If the field effect transistor TA1/TC1 has the low threshold, current flows into the ground line, and the bit line B0/B1 is decayed from the certain level. However, when the field effect transistor TA1/TC1 has the high threshold, no current flows into the ground line, and the bit line B0/B1 is maintained at the certain level.

The potential levels on the bit lines B0/B1 are propagated to the differential amplifiers CM0/CM1, and are compared with the reference level. The reference level is regulated to the certain level and the potential level decayed from the certain level, and the differential amplifiers CM0/CM1 supply read-out data signals representative of the logic level of the data bit read out from the memory cell M11 and the logic level of the data bit read out from the memory cell M12 to the input/output circuit 22d.

The driver circuit 22b keeps the word line F1 in the ground level, the control line C1 in the inactive level and the word line W1 in the inactive level. For this reason, the data bits stored in word "1" are not destroyed.

When the non-volatile ferroelectric memory device is powered on, the data restoring circuit 22e prohibits an external device from a data write-in and a data read-out during the data restoring operation, and instructs the driver circuit 22b to read out the remanence of each ferroelectric capacitor FA/FB/FC/FD.

The driver circuit 22b successively checks the ferroelectric capacitors FA/FC of word "0" and the ferroelectric capacitors FB/FD of word "1" to determine the direction of polarization thereof. Description is made on word "0" only.

The driver circuit 22b changes the control line C0 and the word line W0 to the inactive level, and the word line F0 is grounded. The bias lines D0/D1 are grounded. The driver circuit 22b causes the switching elements TA2/TC2 to turn on so as to transfer the ground level to nodes CA/CC.

Subsequently, the driver circuit 22b causes the bias lines D0/D1 to enter into the floating state. After the entry into the floating state, the word line F0 is lifted to the positive potential level Vdd, then the potential level on each bias line D0/D1 is changed to a certain value determined on the basis of the capacitance of the associated ferroelectric capacitor FA/FC and the parasitic capacitance coupled to the bias line D0/D1. When the word line F0 is changed to the positive potential level, the ferroelectric layer of each capacitor FA/FC either inverts or maintains the polarization depending upon the direction of polarization or the logic level of the data bit stored therein. For this reason, each bias line D0/D1 is regulated to one of two potential levels depending upon the logic level of the data bit.

The differential amplifiers CM3/CM4 compare the potential levels on the bias lines D0/D1 with the reference level between the two potential levels, and reports the direction of polarization in the ferroelectric layer of each capacitor FA/FC to the data restoring circuit 22e. The data restoring circuit 22e determines the logic level of the date bit stored in each memory cell M11/M12 at the previous power-off. The data bits may be temporarily stored in the driver circuit 22b.

While the data restoring circuit 22e is checking word "0" to see whether the data bits had logic "1" level or logic "0" level, the driver circuit 22b maintains the word line F1 at the ground level, the control line C1 at the inactive level and the word line W1 at the inactive level, and prevents the ferroelectric capacitors FB/FD from destruction of polarization.

Subsequently, the data restoring circuit 22e instructs the driver circuit 22b to write the data bits into word "0". The data write-in is carried out through one of the following methods.

If the data bits are restored through the first method, the data bits are applied to the bit lines B0/B1, and the data write-in traces the following sequence. The driver circuit 22b supplies a certain potential level through the bias lines D0/D1 to the node CA/CC, and the nodes CA/CC are equalized in potential level to each other. The driver circuit 22b changes the control line C0 to the inactive level, and the switching elements TA2/TC2 turn off so that the nodes CA/CC enter into the floating state.

The word line F0 is grounded, and the driver circuit 22b selectively applies the positive potential level and the ground level to the bit lines B0/B1 depending upon the logic level of the data bits. Then, the driver circuit 22b changes the word line W0 to the active level, and the switching transistors TA3/TC3 turn on. The driver circuit 22b lifts the word line F0 to the positive potential level, and, thereafter, decays the word line F0 to the ground level. The ferroelectric layers of the capacitors FA/FC are polarized as similar to the data write-in, and the previous data bits are restored in word "0".

If the previous data bits are restored by using the second method, the data restoring sequence is as follows. When the previous data bits were determined, the ferroelectric layers of the capacitors FA/FC were polarized in the predetermined direction due to the high potential level on the word line F0, and the ferroelectric layers have maintained the polarization in the predetermined direction. If the previous data bit or bits are represented by the polarization in the predetermined direction, the node or nodes CA/CC are biased to a certain potential level representing the previous data bit or bits. The certain potential level may be directly measured or determined through a computer simulation.

If the memory cell M11 had the data bit represented by the polarization in the predetermined direction, the driver circuit 22b applies the certain potential level to the bias line D0, and causes the switching element TA2 to turn on so as to bias the node CA to the certain potential level. Thereafter, the driver circuit 22b causes the switching element TA2 to turn off.

On the other hand, if the polarization of the ferroelectric capacitor FA has been inverted, the driver circuit 22b changes the word line F0 to the ground level and the bias line D0 to the positive potential level Vdd. The driver circuit 22b changes the control line C0 to the active level, and the switching element TA2 turns on. Then, the polarization of the ferroelectric layer of the capacitor FA is inverted to the direction representing the previous data bit. The driver circuit 22b biases the node CA to a potential level representing the previous data bit, and causes the switching element TA2 to turn off.

In this way, the previous data bits are restored in the memory cell array 22a, again, and the data restoring circuit 22e allows an external device to write a new data bit and read out the data bit. After the data restoring, the refresh circuit 22g intermittently refreshes the data bits stored in the memory cell array 22a. The refresh circuit 22g counts down a predetermined time. When the predetermined time is expired, the refresh circuit 22g instructs the driver circuit 22b to refresh the data bits in cooperation with the read-out data discriminating circuit 22c. While the data bits are being refreshed, the refresh circuit 22g prohibits an external device from a data write-in and a data read-out.

Firstly, the driver circuit 22b reads out the data bits stored in the memory cells M11 to M22, and temporarily stores the data bits therein. The driver circuit 22b rewrites the data bits into the memory cells M11 to M22 again.

The data are rewritten into word "0" as follows. The driver circuit 22b changes the word line F0 to the positive potential level Vdd, and the bias lines D0/D1 are grounded. The driver circuit 22b changes the control line C0 to the active level, and the switching elements TA2/TC2 turn on so that the ferroelectric layers of the capacitors FA/FC are polarized in a predetermined direction.

Subsequently, the driver circuit 22b changes the word line F0 to the ground level, and applies initial potential levels to the bias lines D0/D1. The nodes CA/CC are biased to the initial potential levels, respectively. The driver circuit 22b causes the switching elements TA2/TC2 to turn off, and the nodes CA/CC enter into the floating state.

Subsequently, the driver circuit 22b selectively applies the positive potential level and the ground level to the bit lines B0/B1 depending upon the data bits to be refreshed, and causes the switching transistors TA3/TC3 to turn on. The word line F0 is firstly lifted to the positive potential level Vdd, and is, thereafter, decayed to the ground level. Then, the read-out data bits are rewritten into the memory cells M11/M12.

The data read-out from word "0" does not destroy the polarization of the ferroelectric capacitors FA/FC. The data refresh may be carried out by compensating the electric charge to the nodes CA/CC. In order to compensate the electric charge, the driver circuit 22b biases the nodes CA/CC through the bias lines D0/D1 to potential levels representing the data bits to be refreshed, and causes the switching elements TA2/TC2 to turn off.

In the above described embodiment, the driver circuit 22b never concurrently drives the bit lines B0/B1 and the bias lines D0/D1. For this reason, conductive lines may be shared between the bit lines B0/B1 and the bias lines D0/D1, and differential amplifiers may be shared between the read-out data discriminating circuit 22c and the stored data discriminating circuit 22f. This results in a simple circuit arrangement.

In this instance, one of or both of the data restoring circuit 22e and the refresh circuit 22g and one of or both of the read-out data discriminating circuit 22c and the stored data discriminating circuit 22f as a whole constitute the charge compensating means.

As will be appreciated from the foregoing description, the data restoring circuit 22e determines data bits stored in the memory cell at the previous power-off so as to restore the data bits in the memory cells, and the refresh circuit 22g recharges the nodes between the ferroelectric capacitors and the field effect transistors so as to refresh the data bits. Thus, the data restoring circuit 22e and the refresh circuit 22g enhance the reliability of the data bits stored in the memory cell array 22a.

Second Embodiment

Figure 9:
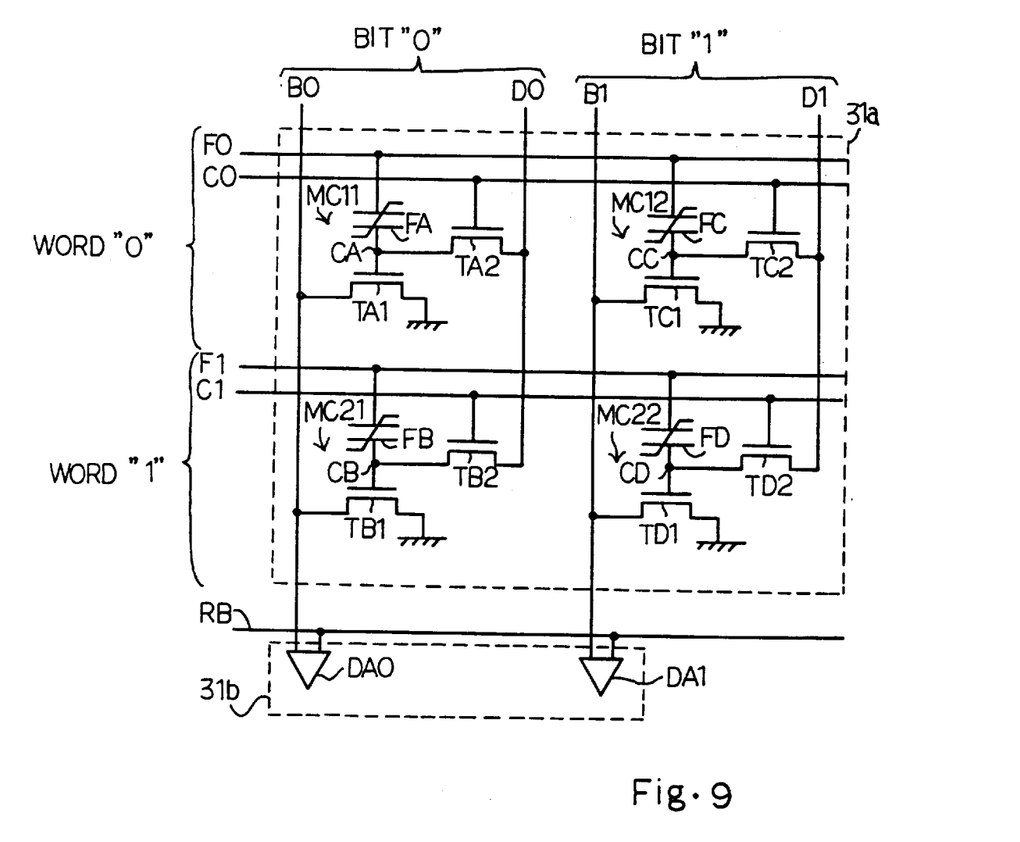
FIG. 9 is a circuit diagram showing a part of a memory cell array incorporated in another non-volatile ferroelectric memory device.

Turning to FIG. 9 of the drawings, memory cells MC11, MC12, MC21 and MC22 are arranged in rows and columns, and form a part of a memory cell array 31a. The memory cell array 31a is incorporated in another non-volatile ferroelectric memory device embodying the present invention. Word lines, bit lines, bias lines and control lines for the memory cells MC11 to MC22 are labeled with the same references as those of the first embodiment. The memory cells MC11/MC12 and MC21/MC22 form word "0" and word "1", respectively, and the columns of memory cells MC1/MC21 and MC12/MC22 are referred to as bit "0" and bit "1", respectively.

The bit lines B0/B1 are connected to differential amplifiers DA0/DA1 of a read-out data discriminating circuit 31b, and a reference line RB supplies a reference voltage to the differential amplifiers DA0/DA1. Although an input/output circuit, a data restoring circuit, a refresh circuit and a driver circuit are incorporated in the non-volatile ferroelectric memory device, they are similar to those of the first embodiment, and are not detailed for the sake of simplicity.

A ferroelectric capacitor FA/FB/FC/FD, a field effect transistor TA1/TB1/TC1/TD1 and a switching element TA2/TB2/TC2/TD2 form the respective memory cell MC11/MC12/MC21/MC22, and nodes between the ferroelectric capacitors FA to FD and the gate electrodes of the field effect transistors TA1 to TD1 are labeled with CA, CB, CC and CD, respectively.

The field effect transistors TA1/TB1 and TC1/TD1 are connected between the bit lines B0/B1 and the ground line, and the ferroelectric capacitors FA/FC and FB/FD are connected between the word lines F0/F1 and the gate electrodes of the field effect transistors TA1/TC1 and TB1/TD1. The switching elements TA2/TB2 and TC2/TD2 are connected between the nodes CA/CB and CC/CD and the bias lines D0/D1. The switching elements TA2/TC2 and TB2/TD2 are gated by the control lines C0/C1, and the bit lines B0/B1, the bias lines D0/D1, the word lines F0/F1 and the control lines C0/C1 are biased by the driver circuit (not shown).

When data bits are written into word "0", the driver circuit selectively biases the bit lines B0/B1, the bias lines D0/D1, the word lines F0/F1 and the control lines C0/C1 as follows.

The control line C0 is changed to the inactive level so that the switching elements TA2/TC2 are turned off. The word line F0 is grounded, and the positive potential level Vdd and the ground level is selectively applied to the bit lines B0/B1 depending upon the data bits to be written into word "0". The word line F0 is lifted to the positive potential level Vdd, and is, thereafter, decayed to the ground level. Thereafter, the bit lines B0/B1 are discharged to the ground level. As a result, a potential difference takes place between the word line F0 and the drain node of each field effect transistor TA1/TC1 at the timing when the word line F0 is biased to one of the positive potential level vdd and the ground level. The potential difference causes the ferroelectric layer of each capacitor FA/FC to be polarized in a direction representing the logic level of the data bit to be written thereinto. The polarized ferroelectric layer changes the field effect transistor TA1/TC1 to either high or low threshold as similar to the first embodiment.

As to non-selected word "1", the word line F1 is biased to a half of the positive potential level Vdd/2 and the control line C1 to the inactive level. The bias conditions do not allow the data bits to be written into word "0" to affect the polarization of word "1".

As described hereinbelow, when the data bits are read out from one of the words, a read-out potential is applied to the word line F0/F1, and the read-out data discriminating circuit 31b determines the logic level of each read-out data bit on the basis of the amount of current passing through the field effect transistor TA1/TB1/TC1/TD1. For this reason, while a non-selected word line F0/F1 is staying in the ground level, the field effect transistors TA1/TB1/TC1/TD1 is designed to allow a negligible amount of current to pass therethrough regardless of the directions of polarization. On the other hand, when the word line F0/F1 is changed from the ground level to the read-out potential level, the field effect transistors TA1/TB1/TC1/TD1 widely varied the current depending upon the directions of polarization or the stored data bits.

When the data bits are read out from word "0", the control line C0 is maintained at the inactive level, and the word line F0 is biased to the read-out potential level. The bit lines B0/B1 are biased to a certain potential level which does not cause the ferroelectric capacitors FA/FC to invert the polarization. In this instance, the bit lines B0/B1 are biased to 0.1 volt. If the field effect transistor TA1/TC1 has the low threshold, a large amount of current flows therethrough. On the other hand, the field effect transistor TA1/TC1 with the high threshold allows only a small amount of current to flow therethrough. The potential level on each bit line B0/B1 is varied depending upon the amount of current, and the differential amplifiers DA0/DA1 determine the logic level of the read-out data bits.

As to non-accessed word "1", the word line F1 is grounded, and the control line C1 is maintained at the inactive level. For this reason, the data bits stored in word "1" are never destroyed.

When the non-volatile ferroelectric memory device is powered on, the previous data bits stored in the memory cell array 31a at the previous power-off are restored as follows. The data restoring circuit prohibits an external device from an access to data bits stored in the memory cell array 31a and a data write into a word of the memory cell array 31a. Although the previous data bits are restored in all of the words, description is focused on word "0" only.

The control line C0 is changed to the inactive level so that the switching elements TA2/TC2 turn off. The word line F0 is grounded, and the bias line D0 is firstly changed to the ground level.

Subsequently, the control line C0 is changed to the active level, and the switching elements TA2.TC2 turn on so as to connect the bias lines D0/D1 to the nodes CA/CC, respectively. Then, the nodes CA/CC are biased to the ground level.

Subsequently, the control line C0 is changed to the inactive level, and the switching elements TA2/TC2 turn off. The word line F0 is changed to the positive potential level Vdd, and the inversion of polarization selectively takes place in the ferroelectric layers depending upon the direction of polarization at the power-on. As a result, each of the nodes CA/CC has one of the two potential level depending upon either inverted or non-inverted polarization, and changes the threshold of the associated field effect transistor TA1/TC1 between the high level and the low level.

A read-out potential is applied to the word line F0, and the bit lines B0/B1 are biased to 0.1 volt so see whether or not current flows through the field effect transistors TA1/TC1. The current affects the potential levels on the bit lines B0/B1, and the differential amplifiers DA0/DA1 compare the potential levels on the bit lines B0/B1 with the reference level so as to determine the logic level of the previous data bits.

The word line F1 is maintained at the ground level, and the control line C1 maintains the switching elements TB2/TD2 in the off-state.

Subsequently, the previous data bits are written into word "0". The word line F0 is changed to the ground level, and the control line C0 is changed to the active level so that the switching elements TA2/TC2 turn on. An initial potential level is applied to the bias lines D0/D1, and the nodes CA/CC are equalized at the initial potential level.

Thereafter, the control line C0 is changed to the inactive level, and the switching elements TA2/TC2 turn off so that the nodes CA/CC enter into the floating state.

Subsequently, the word line F0 is changed to the ground level, and the positive potential level Vdd and the ground level are selectively applied to the bit lines B0/B1 depending upon the previous data bits. The word line F0 is lifted to the positive potential level Vdd, and is, thereafter, decayed to the ground level. Then, the previous data bits are written into word "0".

Alternatively, only the inverted polarization is recovered to the initial direction, and the movable electric charge is supplied to the nodes CA/CC regardless of the inversion of polarization. In detail, when the previous data bits were read out from word "0", the ferroelectric layers were oriented to a predetermined direction due to the high potential level on the word line F0. If the ferroelectric layer of the memory cell MC11/MC12 was oriented in the predetermined direction before the read-out of the previous data bits, the node CA/CC is only biased to the potential level representative of the logic level of the previous data bit. On the other hand, the polarization of the ferroelectric layer was inverted during the read-out of the previous data bit, the polarization is inverted again, and the node is biased to the potential level representative of the logic level of the previous data bit.

If the inversion took place in the ferroelectric layer of the memory cell MC11 and does not take place in the ferroelectric layer of the memory cell MC12, the word line F0 is grounded, and the bias line D0 is changed to the positive potential level Vdd. The control line C0 is changed to the active level, and the switching elements TA2/TC2 turn on. The positive potential level Vdd on the bias line D0 inverts the polarization of the ferroelectric layer of the capacitor FA. Thereafter, the nodes CA/CC are biased to the potential levels representing the previous data bits.

When the data restoring is completed, the data restoring circuit allows an external device to write new data bits into and read out the data bits from the memory cell array 31a.

When a predetermined time period is expired from the previous data refresh or the data restoring, a refreshing sequence starts. The refresh circuit prohibits an external device from a data write-in and a data read-out. Although the data bits in all the words are sequentially refreshed, description is focused on word "0" only.

The data bits is firstly read out from word "0" without destruction of the polarization of the ferroelectric layers, and are temporarily stored. Subsequently, the polarization of all ferroelectric layers are oriented in a predetermined direction. When the word line F0 is changed to the positive potential level, the bias lines D0/D1 are changed to the ground level and the control line C0 is changed to the active level, the switching elements TA2/TC2 turn on, and all the ferroelectric layers are polarized in the predetermined direction.

Subsequently, the word line F0 is changed to the ground level, and the initial potential level is applied to the bias lines D0/D1. Thereafter, the switching elements TA2/TC2 turn off, and the nodes CA/CC enter into the floating state. The bit lines B0/B1 are selectively biased to the potential levels representing the read-out data bits, i.e., the positive potential level Vdd and the ground level. The word line F0 is firstly lifted to the positive potential level Vdd, and is, thereafter, decayed to the ground level.

The data read-out in the refreshing sequence does not destroy the polarization of the ferroelectric layers, and, for this reason, the movable electric charge are simply made up at the nodes CA/CC. The nodes CA/CC are biased through the bias lines D0/D1 to the potential levels representing the read-out data bits, and the switching elements TA2/TC2 turn off.

In this instance, a plurality of conductive lines may be shared between the bit lines B0/B1 and the bias lines D0/D1, because the bit lines B0/B1 and the bias lines D0/D1 are never concurrently biased.

As will be appreciated from the foregoing description, the previous data bits are restored in the memory cell array 31a at a power-on event, and the nodes CA–CD are compensated for loss of the movable electric charge. As a result, the reliability of data bits is surely enhanced.

Although particular embodiments of the present invention have been shown and described, it will be obvious to those skilled in the art that various changes and modifications may be made without departing from the spirit and scope of the present invention.

For example, the non-volatile ferroelectric memory device may be fabricated on a semiconductor chip or integrated with other function blocks on a semiconductor chip.

The switching element and the switching transistor may be implemented by another kind of transistor such as, for example, a bipolar transistor.

What is claimed is:

1. A non-volatile ferroelectric memory device comprising:
   a plurality of addressable memory cells for storing data bits therein, respectively, each of said plurality of addressable memory cells including
      a capacitor having a ferroelectric layer sandwiched between first and second electrodes and polarized in a first direction representative of a first logic level of one of said data bits or a second direction representative of a second logic level of said one of said data bits,
      a field effect transistor having a channel region having a first and a second end,
      the first end connected to a constant potential line and a gate electrode connected to said second electrode for changing a threshold between a first level and a second level depending upon the direction of said polarization due to a movable electric charge induced therein in the presence of said polarization, and
      a switching element having a control node, a first node and a second node connected to said gate electrode;
   a plurality of word lines selectively connected to the first electrodes of the capacitors of said plurality of addressable memory cells;
   a plurality of bit lines selectively connectable to the second end of the channels of the field effect transistors of said plurality of addressable memory cells;
   a plurality of bias lines selectively connected to the first nodes of the switching elements of said plurality of addressable memory cells;
   a plurality of control lines, different from the plurality of word lines, selectively connected to the control nodes of the switching elements of said plurality of addressable memory cells;
   a driver circuit selectively biasing said plurality of word lines, said plurality of bit lines, said plurality of bias lines and said plurality of control lines for selectively writing said data bits into said plurality of addressable memory cells, selectively reading out said data bits and compensating the gate electrodes of said field effect transistors for loss of the movable electric charges; and
   a charge compensating means checking the polarization of the ferroelectric layers of said plurality of addressable memory cells to determine whether said ferroelectric layers have been polarized in said first direction or said second direction, and causing said driver circuit to compensate said gate electrodes of said field effect transistors for the loss of said movable electric charges.

2. The non-volatile ferroelectric memory device as set forth in claim 1, in which a plurality of conductive lines serve as both of said plurality of bit lines and said plurality of bias lines.

3. The non-volatile ferroelectric memory device as set forth in claim 1, in which said gate electrode of said field effect transistor is integral with said second electrode of said capacitor.

4. The non-volatile ferroelectric memory device as set forth in claim 1, in which said each of said memory cells further includes a switching transistor connected between said second end of said channel region and an associated one of said plurality of bit lines and gated by one of auxiliary word lines.

5. The non-volatile ferroelectric memory device as set forth in claim 1, in which said second end of said channel region is directly connected to an associated one of said plurality of bit lines.

6. The non-volatile ferroelectric memory device as set forth in claim 1, in which said charge compensating means includes
   a data restoring circuit activated when said non-volatile ferroelectric memory device is powered on, and causing said driver circuit to read out said data bits each represented by the direction of said polarization and to compensate said gate electrodes for said movable electric charges corresponding to the logic level of said data bits.

7. The non-volatile ferroelectric memory device as set forth in claim 6, in which said charge compensating means further includes
   a refresh circuit intermittently activated after said non-volatile ferroelectric memory device is powered on, and causing said driver circuit to read out said data bits and to compensate said gate electrodes for said movable electric charges corresponding to the logic level of said data bits.

8. A method of controlling a non-volatile ferroelectric memory device including at least one memory cell having a field effect transistor for providing one of a conductive channel and a resistive channel between a bit line and a constant potential line, a capacitor connected between a gate electrode of said field effect transistor and a word line and having a ferroelectric layer polarized in a certain direction representative of a logic level of a data bit and a switching transistor gated by a control line so as to connect a bias line to said gate electrode of said field effect transistor, comprising the steps of:
   a) biasing said gate electrode of said field effect transistor to a first potential level through said bias line without changing said direction of polarization;
   b) changing said word line to a second potential level high enough to orient said polarization in a predetermined direction to determine whether or not said ferroelectric layer polarized in said predetermined direction induces a movable electric charge in said gate electrode for determining said certain direction representative of said logic level of said data bit; and c) changing said polarization of said ferroelectric layer and said gate electrode to said certain direction and a third potential level expected under said polarization in said certain direction, respectively.

9. The method as set forth in claim 8, in which said step b) includes the sub-steps of b-1) changing said word line to said second potential level to see whether or not the potential level of said gate electrode is changed due to said movable electric charge; and b-2) determining said certain direction on the basis of said potential level of said gate electrode.

10. The method as set forth in claim 9, in which said potential level of said gate electrode is propagated to said bias line so as to compare said potential level with a reference potential level in said step b-2).

11. The method as set forth in claim 8, in which said step b) includes the sub-steps of b-1) changing said word line to said second potential level to see whether or not the potential level of said gate electrode is changed due to said movable electric charge;

b-2) supplying current from said bit line to said field effect transistor to see whether said field effect transistor has either conductive or resistive channel; and b-3) determining said certain direction on the basis of a potential level of said bit line.

12. The method as set forth in claim 11, in which said potential level of said bit line is compared with a reference potential level in said step b-3).

13. The method as set forth in claim 8, in which said step c) includes the sub-steps of c-1) isolating said gate electrode from said bias line;

c-2) applying one of a fourth potential level representative of a first logic level of said data bit and a fifth potential level representative of a second logic level of said data bit to a drain node of said field effect transistor; and c-3) changing said word line from said fourth potential level to said fifth potential level and, thereafter, from said fifth potential level to said fourth potential level so as to polarize said ferroelectric layer in said certain direction.

14. The method as set forth in claim 8, in which said step c) includes the sub-steps of c-1) supplying a fourth potential level and a fifth potential level to said word line and said gate electrode through said switching transistor so as to invert said polarization of said ferroelectric layer if said predetermined direction is opposite to said certain direction; and c-2) supplying said third potential level from said bias line through said switching transistor to said gate electrode.

15. The method as set forth in claim 8, in which an external device is prohibited from a data write-in and a data read-out until said step c) is completed.

16. A method of controlling a non-volatile ferroelectric memory device including at least one memory cell having a field effect transistor for providing one of a conductive channel and a resistive channel between a bit line and a constant potential line in the presence of a movable electric charge, a capacitor connected between a gate electrode of said field effect transistor and a word line and having a ferroelectric layer polarized in a certain direction representative of a logic level of a data bit for inducing said movable electric charge in said gate electrode and a switching transistor gated by a control line so as to connect a bias line to said gate electrode of said field effect transistor, comprising the steps of a) checking a clock to determine whether or not a certain time period is expired;

b) reading out said data bit from said at least one memory cell so as to determine said logic level of said data bit when said certain time period is expired; and c) supplementing said movable electric charge to said gate electrode.

17. The method as set forth in claim 16, in which said step b) includes the sub-steps of b-1) applying a first potential level making the channel of said field effect transistor conductive or resistive without an inversion of said polarization, b-2) applying current from said bit line to said field effect transistor to see whether said channel is conductive or resistive, and b-3) determining said logic level of said data bit on the basis of the amount of said current.

18. The method as set forth in claim 16, in which said step c) includes the sub-steps of c-1) orienting said polarization to a predetermined direction, c-2) isolating said gate electrode from said bias line;

c-3) applying one of a first potential level representative of a first logic level of said data bit and a second potential level representative of a second logic level of said data bit from said bit line to a drain node of said field effect transistor, and c-4) changing said word line from said first potential level to said second potential level and, thereafter, from said second potential level to said first potential level so as to induce said movable electric charge in said gate electrode by virtue of said polarization in said certain direction.

19. The method as set forth in claim 16, in which said step c) includes the sub-steps of c-1) connecting said gate electrode to said bias line, and c-2) biasing said gate electrode to a first potential level expected in the presence of said polarization in said certain direction.

20. The method as set forth in claim 16, in which an external device is prohibited from a data write-in and a data read-out until said step c) is completed.

* * * * *